(12) United States Patent
Kang

(10) Patent No.: US 7,713,770 B2
(45) Date of Patent: May 11, 2010

(54) FABRICATION METHOD OF NITRIDE SEMICONDUCTOR LIGHT EMITTING DEVICE AND NITRIDE SEMICONDUCTOR LIGHT EMITTING DEVICE THEREBY

(75) Inventor: Dae Sung Kang, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 79 days.

(21) Appl. No.: 11/527,672

(22) Filed: Sep. 27, 2006

(65) Prior Publication Data

US 2007/0069226 A1     Mar. 29, 2007

(30) Foreign Application Priority Data

Sep. 28, 2005  (KR) ................. 10-2005-0090291

(51) Int. Cl.
*H01L 33/00* (2006.01)

(52) U.S. Cl. .................. 438/47; 257/94; 257/103; 257/E33.025; 257/E33.028; 257/E21.142; 257/E21.152; 257/E21.367

(58) Field of Classification Search .............. 438/47
See application file for complete search history.

(56) References Cited

U.S. PATENT DOCUMENTS

| | | | |
|---|---|---|---|
| 5,306,662 A * | 4/1994 | Nakamura et al. | 438/509 |
| 6,989,598 B2 * | 1/2006 | Song et al. | 257/743 |

* cited by examiner

*Primary Examiner*—Jerome Jackson, Jr.
(74) *Attorney, Agent, or Firm*—Birch, Stewart, Kolasch & Birch, LLP

(57) ABSTRACT

A method for fabricating a nitride semiconductor light emitting device, and a nitride semiconductor light emitting device fabricated thereby are provided. The method includes: forming a first conductive nitride semiconductor layer on a substrate; forming an active layer on the first conductive nitride semiconductor layer; forming a second conductive nitride semiconductor layer on the active layer; and lowering a temperature while adding oxygen to the result by performing a thermal process.

10 Claims, 3 Drawing Sheets

FABRICATION METHOD OF NITRIDE SEMICONDUCTOR LIGHT EMITTING DEVICE AND NITRIDE SEMICONDUCTOR LIGHT EMITTING DEVICE THEREBY

BACKGROUND OF THE INVENTION

1. Field of the Invention

The present invention relates to a method of fabricating a nitride semiconductor light emitting device, and a nitride semiconductor light emitting device fabricated thereby.

2. Description of the Related Art

Nitride semiconductors have been receiving attention as a raw material of blue light emitting diode or blue laser diode.

Such a nitride semiconductor light emitting device is grown on a sapphire substrate or a SiC substrate. Then, a polycrystalline thin film $Al_yGa_{1-y}N$ is grown on a sapphire substrate or a SiC substrate at a low temperature as a buffer layer.

Afterward, an n-GaN layer is formed on the buffer layer by growing an undoped GaN layer and a silicon doped n-GaN layer, or a composite structure thereof at a high temperature. Then, a magnesium Mg doped p-GaN layer is formed thereon so as to fabricate a nitride semiconductor light emitting device. A light emitting layer, which is a single quantum well structure or a multi quantum well structure, is formed as a sandwich structure between the n-GaN layer and the p-GaN layer.

The p-GaN layer is formed by doping a GaN layer with Mg atoms in crystal growth. During crystal growth, Mg atoms injected as a doping source are placed at Ga locations to form the p-GaN layer. However, Mg atoms react with hydrogen gas from a carrier gas or a source. As a result, Mg—H complex is formed thereby. Therefore, the Mg—H complex may become a high resistor, for example, about 10 MΩ.

Therefore, a post-activation process is required after forming a p-n junction light emitting device to place the Mg atoms to Ga locations by disjoining Mg—H complex. However, the amount of carrier for light emitting in the activation process is about $2.25\times10^{17}/cm^3$ in the light emitting device. Therefore, it is difficult to form a resistive contact.

Therefore, there are many researches in progress for overcoming the shortcomings arisen by Mg—H complex.

SUMMARY OF THE INVENTION

The present invention provides a method for fabricating a nitride semiconductor light emitting device and a nitride semiconductor light emitting device fabricated thereby for improving electrical and optical characteristics and reliability thereof.

The embodiment of the present invention provides a method for fabricating a nitride semiconductor light emitting device. The method includes: forming a first conductive nitride semiconductor layer on a substrate; forming an active layer on the first conductive nitride semiconductor layer; forming a second conductive nitride semiconductor layer on the active layer; and lowering a temperature while adding oxygen to the result by performing a thermal process.

The embodiment of the present invention provides a nitride semiconductor light emitting device including: a first conductive nitride semiconductor layer; an active layer formed on the first conductive nitride semiconductor layer; and a second conductive nitride semiconductor layer formed on the active layer, wherein the second conductive nitride semiconductor layer is thermal processed by reducing temperature while adding oxygen.

DETAILED DESCRIPTION OF THE INVENTION

It will be understood that when an element such as a layer, film, region, pattern, structure, or substrate is referred to as being "on" another element or to as being "under" another element, it can be directly on or under the other element or intervening elements may also be present (i.e. "indirectly").

Hereinafter, the embodiment of the present invention will be described with reference to accompanying drawings.

Figure 1:
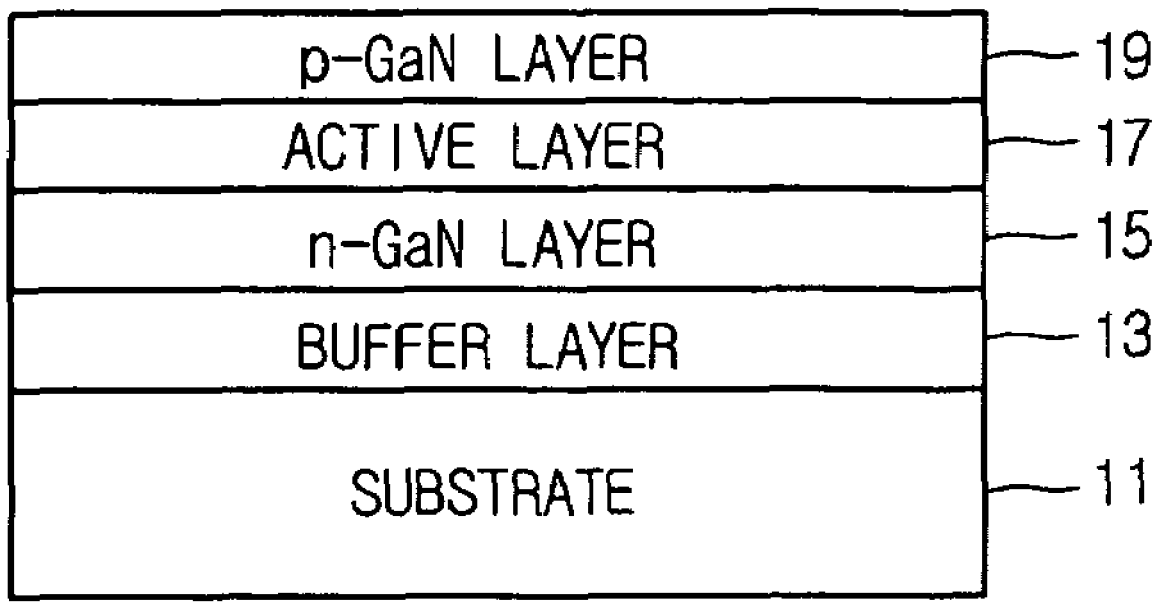
FIG. 1 is a schematic view illustrating a stacking structure of a nitride semiconductor light emitting device according to an embodiment of the present invention.
Figure 2:
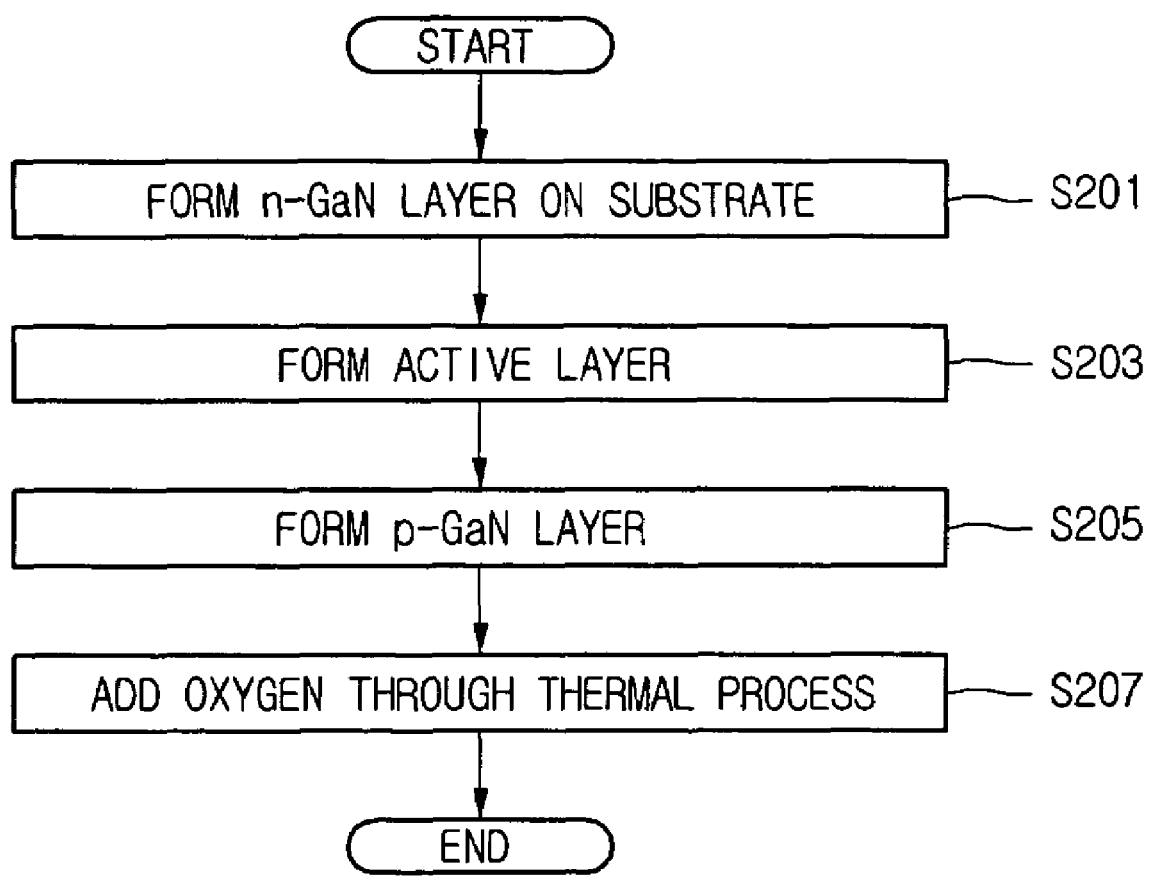
FIG. 2 is a flowchart for describing a method for fabricating a nitride semiconductor light emitting device according to an embodiment of the present invention.

A method for fabricating a nitride semiconductor light emitting device according to an embodiment of the present invention will be described with reference to FIGS. 1 and 2. FIG. 1 is a schematic view illustrating a stacking structure of a nitride semiconductor light emitting device according to an embodiment of the present invention, and FIG. 2 is a flowchart for describing a method for fabricating a nitride semiconductor light emitting device according to an embodiment of the present invention.

In the fabricating method according to the present embodiment, a first conductive nitride semiconductor 15 is formed on a substrate 11 in operation S201.

The first conductive nitride semiconductor layer 15 may be formed as an n-GaN layer. In this case, a buffer layer 13 may be formed on the substrate 11, and then the first conductive nitride semiconductor layer 15 may be formed on the buffer layer 13.

Herein, the buffer layer 13 may be formed as one selected stacking structures from AlInN/GaN, $In_xGa_{1-x}N/GaN$, and $Al_xIn_yGa_{1-(x+y)}N/In_xGa_{1-x}N/GaN$. As the first conductive nitride semiconductor layer 15, an InGaN layer may be employed. Also, the InGaN layer with Si doped InGaN formed above may be employed as the first conductive nitride semiconductor layer.

Then, an active layer 17 is formed on the first conductive nitride semiconductor layer 15 in operation S203. Herein, the active layer 17 may be formed to have single quantum well structure or multi quantum well structure. For example, the active layer 17 may be formed of an InGaN well layer and an InGaN barrier layer.

Then, a second conductive nitride semiconductor layer 19 is formed on the active layer 17 in operation S205.

The second conductive nitride semiconductor layer 19 may be formed as a p-GaN layer. Herein, the second conductive nitride semiconductor layer 19 may be formed through magnesium Mg doping.

Herein, the second conductive nitride semiconductor layer 19 may be formed as a structure where the Mg doping amount gradually increases. Also, the second conductive nitride semiconductor layer 19 may be formed as a multi-layer structure where the Mg doping amount increases step by step. For example, the second conductive nitride semiconductor layer 19 may be formed as a three-layer structure where the Mg doping amount varies in three steps.

Also, the second conductive nitride semiconductor layer 19 may be grown at about 500 to 2500 Å of thickness in about 900 to 1020° C.

Afterward, a thermal process is performed to add oxygen while lowering the temperature in operation S207.

Herein, the thermal process may add oxygen to the resulting in a $N_2$ atmosphere while lowering the temperature. Such a thermal process reduces the Mg—H complex formed at the second conductive nitride semiconductor layer 19.

As described above, the fabricating method according to the present embodiment can improve the electrical and optical characteristics of the nitride semiconductor light emitting device.

Figure 3:
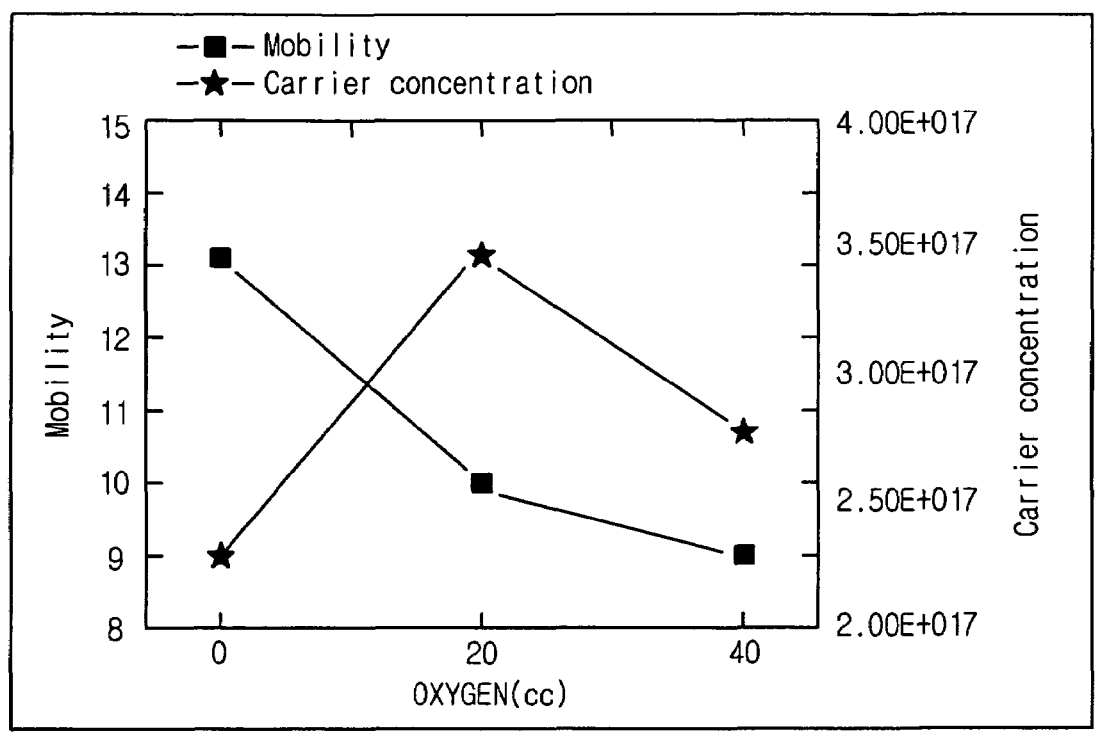
FIG. 3 is a graph showing the characteristics of a nitride semiconductor light emitting device according to an embodiment of the present invention.

In the thermal process, the temperature is dropped to a room temperature, and about 10 to 30 cc of oxygen is added. The characteristics of nitride semiconductor light emitting device will vary as shown in FIG. 3 through controlling the amount of oxygen. FIG. 3 is a graph showing the characteristics of a nitride semiconductor light emitting device according to an embodiment of the present invention.

The fabricating method according to the present embodiment removes the high contact resistance generated by low Mg doping efficiency of the second conductive nitride semiconductor layer 19 and removes the current crowding around an electrode, which is caused by the high contact resistance. Therefore, the fabricating method according to the present embodiment increases the carrier concentration of the second conductive nitride semiconductor layer 19.

Meanwhile, in the nitride semiconductor light emitting device according to the related art, the carrier concentration of the n-GaN layer is about $(mid) \times 10^{18}$, and the carrier concentration of the p-GaN layer is very low, for example, about $2.25 \times 10^{17}$. Such a low carrier concentration reduces the amount of carriers injected into a quantum well. Accordingly, the light emitting efficiency is reduced and the high driving voltage is required in the nitride semiconductor light emitting device according to the related art.

However, the fabricating method according to the present embodiment can increase the carrier concentration up to two times through the thermal process that adds a small amount of oxygen while reducing the temperature after growing the second conductive nitride semiconductor layer 19.

The Mg—H complex is a defect that disturbs Mg to act as a free carrier. Meanwhile, as described above, the carrier concentration of the second conductive nitride semiconductor layer, for example, p-GaN layer, increases by adding the small amount of oxygen. It is because the added oxygen $O_2$ is combined with H for out-diffusion. As a result, the Mg—H complex at the second nitride semiconductor layer, for example, the p-GaN layer, is reduced.

As described above, a nitride semiconductor light emitting device fabricated by the method for fabricating a nitride semiconductor light emitting device of the present invention may be improved electrical and optical characteristics and reliability.

What is claimed is:

1. A method for fabricating a nitride semiconductor light emitting device, the method comprising:
    forming a first conductive nitride semiconductor layer on a substrate in a growth chamber;
    forming an active layer on the first conductive nitride semiconductor layer in the growth chamber;
    forming a second conductive nitride semiconductor layer on the active layer at a first temperature of 900 to 1020° C. in the growth chamber, the second conductive nitride semiconductor layer including a Mg—H complex;
    forming a $N_2$ atmosphere in the growth chamber; and
    adding oxygen to the growth chamber while lowering a temperature from the first temperature to room temperature so as to combine the oxygen with the H of the Mg—H complex and out-diffuse the combination of the oxygen and H from the second conductive nitride semiconductor layer.

2. The method according to claim 1, wherein the first nitride semiconductor layer is an n-type, and the second nitride semiconductor layer is a p-type.

3. The method according to claim 1, comprising forming a buffer layer before forming the first conductive nitride semiconductor layer.

4. The method according to claim 1, wherein the active layer is formed as a single quantum well structure or a multi quantum well structure.

5. The method according to claim 1, wherein the second conductive nitride semiconductor layer is formed through magnesium Mg doping.

6. The method according to claim 1, wherein the second conductive nitride semiconductor layer is formed as a structure where a magnesium Mg doping amount gradually increases.

7. The method according to claim 1, wherein the second conductive nitride semiconductor layer is formed as a multi-layer structure where a magnesium Mg doping amount increases step-by-step.

8. The method according to claim 1, wherein the second conductive nitride semiconductor layer is formed at about 500 to 2500 Å of thickness.

9. The method according to claim 1, wherein the steps of forming a first conductive nitride semiconductor layer, forming an active layer, forming a second conductive nitride semiconductor layer, forming a N2 atmosphere and adding oxygen are processed in-situ in the growth chamber.

10. The method according to claim 1, wherein a top surface of the second conductive nitride semiconductor layer is exposed to the oxygen when the oxygen is added.

* * * * *